United States Patent [19]
Scharfe, Jr.

[11] Patent Number: 6,078,299
[45] Date of Patent: Jun. 20, 2000

[54] MULTI-PHASE COUPLER WITH A NOISE REDUCTION CIRCUIT

[76] Inventor: James A. Scharfe, Jr., P.O. Box 6160, Nogales, Ariz. 85628

[21] Appl. No.: 09/058,668

[22] Filed: Apr. 10, 1998

[51] Int. Cl.[7] .............................. H01P 5/12; H03H 11/20; H01Q 9/16
[52] U.S. Cl. .......................... 343/858; 343/859; 333/117; 333/118; 333/124; 333/131; 333/138; 333/139
[58] Field of Search ..................................... 333/117, 118, 333/124, 131, 25, 138, 139, 156, 164; 343/858, 859

[56] References Cited

U.S. PATENT DOCUMENTS

| | | | |
|---|---|---|---|
| 4,558,291 | 12/1985 | Nichols | 333/138 |
| 4,992,761 | 2/1991 | Seely et al. | 333/138 X |
| 5,148,130 | 9/1992 | Dietrich | 333/25 |
| 5,155,495 | 10/1992 | Hately | 343/725 |

FOREIGN PATENT DOCUMENTS

| | | | |
|---|---|---|---|
| 89614 | 4/1991 | Japan | 333/139 |

OTHER PUBLICATIONS

"Phasing Network for Broadcast Arrays" by C. R. Cox, pp. 5–8 of the Electronics Manual for Radio Engineers published by the McGraw–Hill Book Co., Inc. in 1949.

"Phase Monitor for Broadcast Arrays" by Bernard C. O'Brien and Francis L. Sherwood, pp. 9 & 10 of the Electronics Manual for Radio published by the McGraw–Hill Book Co, Inc. in 1949.

"An Improved Z–match ASTU" by Louis Varney, pp. 116–119 of the HF Antenna Collection, edit by Erwin David and published bythe Radio Society of Great Britian, published earlier in RadCom in Oct. 1985.

"The Z–Match Antenna Tuning Unit" by Bill Orr, pp. 50–52, CQ Magazine, Aug. 1993.

"The Z–Match Tuner for 160 Meters" by Bill Orr, p. 86, CQ Magazine, Oct. 1993.

"A Word on the Z–Match Tuner" by Bill Orr, pp. 112 & 114, CQ Magazine, Dec. 1993.

"Phased Verticals with Continuous Phase Control" by Peter K. Anderson, pp. 72–75 in Vertical Antenna Classics by The American Radio Relay League, 225, Main St., Newington, CT 06111.

"Tuning up a QRP battle plan" by Richard Fisher, pp. 48–50 of Worldradio Magazine, May 1998 Post Office Box 189490, Sacramento, CA 95818–9490.

"Phased Trapped Verticals for HF" by Laurence O. (Curt) Raynes, pp. 21 & 22 of 73 Ham Radio Today magazine, Oct. 1997.

"The Application of Characteristic–Mode Techniques to Vehicle–Mounted NVIS Antennas" by Brian A. Austin and Kevin P. Murray, pp. 7–19 of IEEE Antennas and Propagation Magazine, Feb. 1998.

Radio Amateurs handbook, pp. 14–6 and 18–2, published by the American Radio Relay League (ARRL) in 1983.

"Antenna Theory and Design" by Warren L. Stuzman and Gary A. Thiele, pp. 108–123, published by John Wiley and Sons, Inc. in 1981.

(List continued on next page.)

*Primary Examiner*—Benny T. Lee
*Attorney, Agent, or Firm*—Harold E. Gillmann

[57] ABSTRACT

A multi-phase coupler including a noise reduction circuit which provides two output signals which are separately shifted in phase with respect to an input radio frequency (RF) signal. The input RF signal is capacitively phase-shifted to lead the phase of an input RF signal to provide one output signal and is inductively phase-shifted to lag the phase of an input RF signal to provide a second output signal. The two phase-shifted outputs are impedance matched to the dual input ports of a balanced radiating structure that acts as a point source when the input ports are driven in phase quadrature.

27 Claims, 2 Drawing Sheets

OTHER PUBLICATIONS

Chapters 3 and 4 of "Antennas" by John D. Kraus, pp. 86–199 in thesecond edition published by McGraw–Hill in 1988.

"The Z–Match Antenna Coupler" by Allen W. King, QST Magazine, May 1955, 4 pages.

"Matching Circuit with Multi–Band Tuner," Product Review, 1955, published earlier in QST Magazine, in May 1955, 2 pages.

"The Z–Match Revisited" by Bill Orr, pp. 90–94 of CQ Magazine, Sep. 1993.

Instruction manual for "Automatic Antenna Tuner Autotrack Model AT–2500" from J. W. Miller Division of Bell Industries, 19070 Reyes Avenue, Post Office Box 5825, Compton, CA 90224 pp 1–8.

"Antenna Power Divider," by Earle Travis, p. 4 of Electronics Manual for Radio Engineers, published by the McGraw–Hill Book Co, Inc. in 1949.

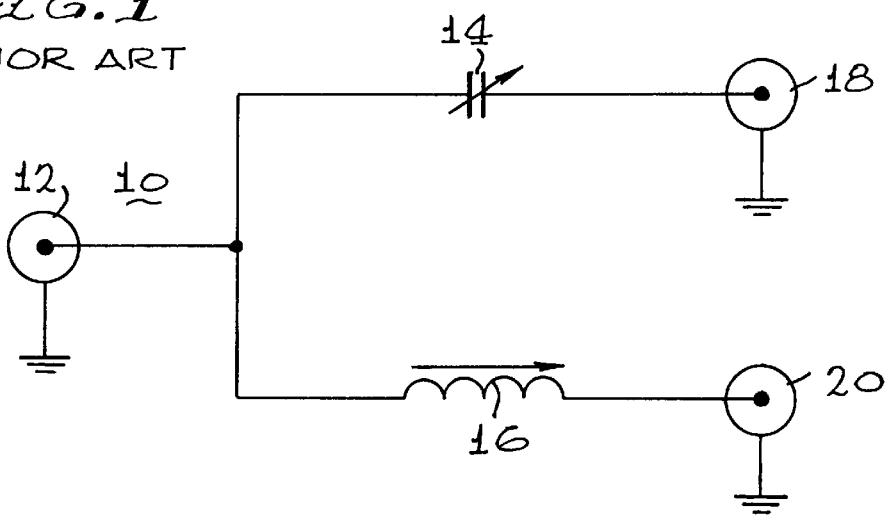
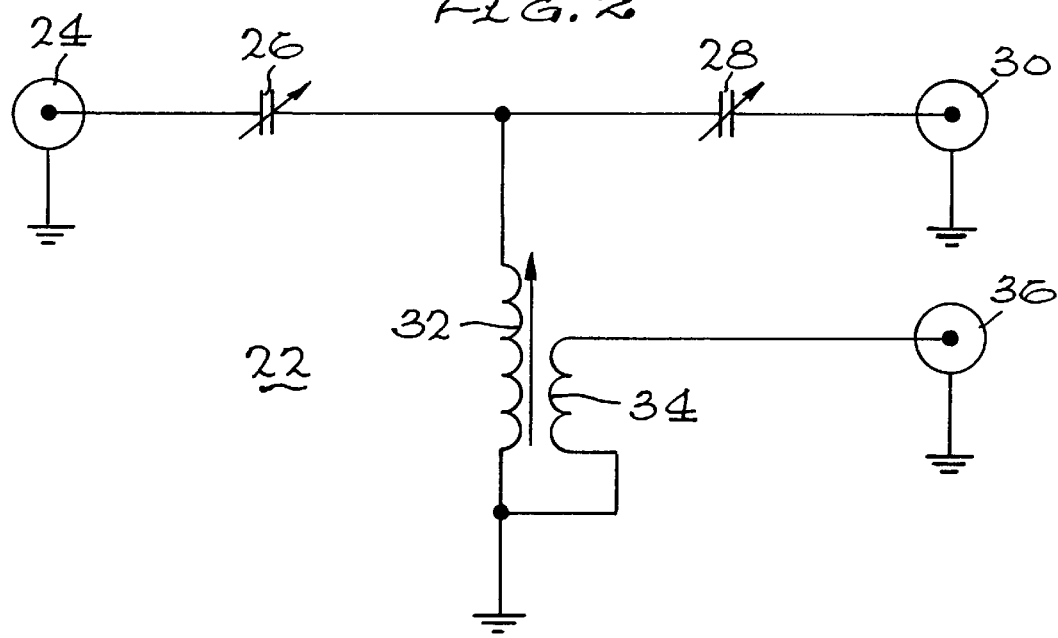
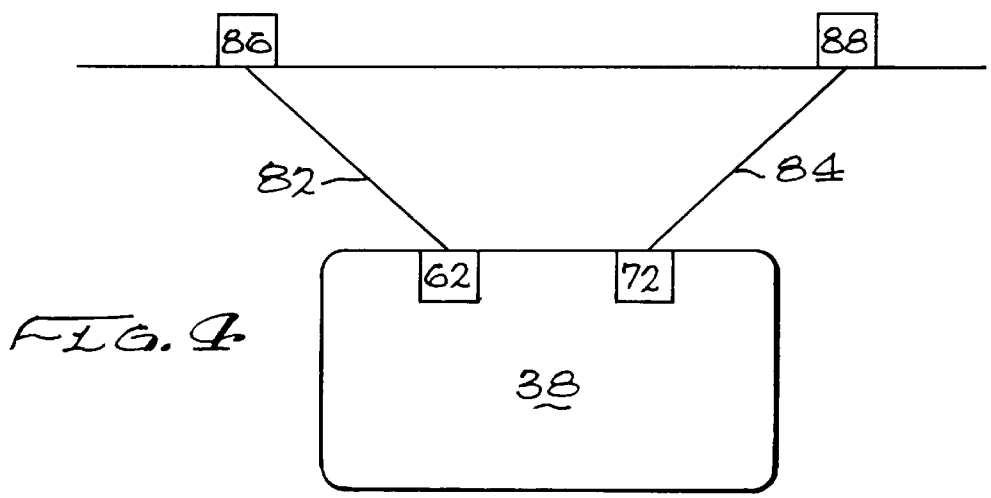

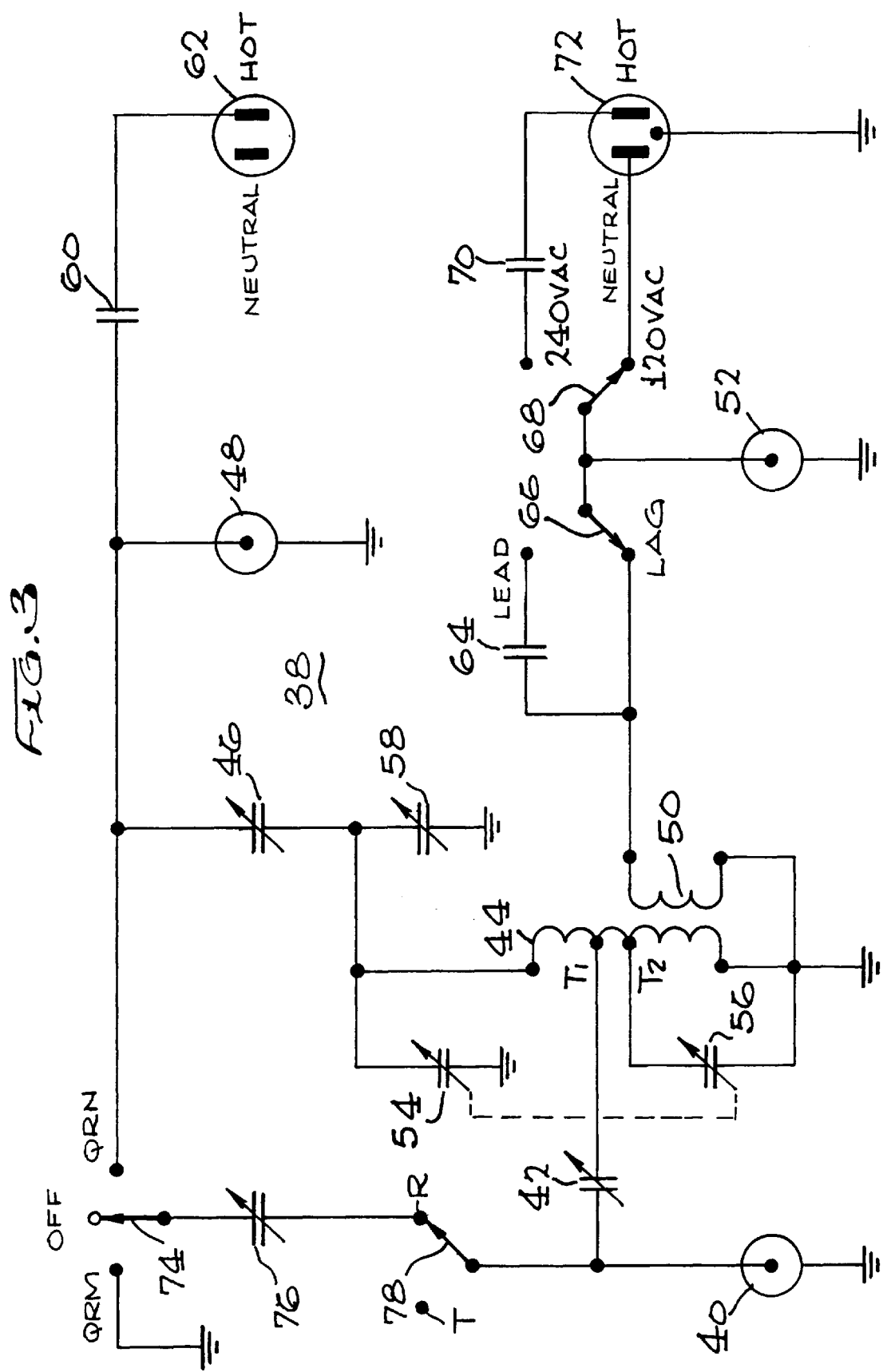

MULTI-PHASE COUPLER WITH A NOISE REDUCTION CIRCUIT

FIELD OF THE INVENTION

The present invention relates to the field of device for radio transmission and reception, and more specifically, to a coupler that divides and shifts the phase of an input radio frequency (RF) signal into at least two output signals having phases that differ from each other and that differ from the phase of the input RF signal. Adjustment of the phase difference between two output signals to phase quadrature permits the use of a structure's wiring or balanced feedlines to perform as both transmitting and receiving antennas.

SUMMARY OF THE INVENTION

The multi-phase coupler with a noise reduction circuit provides at least two output signals that have been divided from an input RF signal and separately shifted in phase from the phase of the input RF signal. When the two phase-shifted output signals are connected to a balanced feedline, a RF signal is radiated as if the balanced feedline were unbalanced and the RF signals were balanced in phase. The phase shift between the two output signals is created by directing the input RF signal received at an input through a capacitive output circuit to provide one output signal and through an inductive output circuit to provide the other output signal. The phase of the output signal from the capacitive circuit leads the phase of the input RF signal and the phase of the output signal from the inductive output circuit lags the phase of the input RF signal. The coupler of the invention also matches the impedance of the RF output signals to the impedance of antennas such as two lines of alternating current (AC) electrical wiring of a building or a balanced feedline. The coupler is reciprocal in operation and operates in both transmit and receive modes. The coupler may be used in combination with other types of antennas including vertical antennas.

The inductive output circuit is connected to the input to receive the input signal for shifting inductively the phase of the input signal, the inductive circuit outputting a first output signal having a phase which lags the phase of the input signal, the inductive output circuit comprises a first and a second coil, one end of the first coil being connected to said capacitive input circuit to receive the input radio frequency signal and said second coil inductively coupled to said first coil for outputting the second output radio frequency signal. The capacitive output circuit is connected to the input to receive the input signal for shifting capacitively the phase of the input signal, the capacitive circuit provides a second output signal having a phase which leads the phase of the input signal. The input may be a capacitive input circuit for matching the input signal to said inductive output circuit and the capacitive output circuit is adjustable for varying the phase angle between the first and second output signals.

The preferred embodiment of the antenna coupler of the invention provides operation at MF, HF and VHF radio frequencies without the use of a conventional antenna. When the coupler is operated in the preferred "no antenna" mode, the coupler produces two output signals that have a phase difference of 90 degrees. This condition of a phase difference of 90 degrees between two signals is known as phase quadrature. A balanced (non-radiating) two-wire feedline may be created from a common 120 VAC (volts alternating current) household wire pair connected to the power mains. One side of the pair is usually grounded at the point where AC electrical power is brought in to a user's building and this side of the pair is the "neutral." The other side of the pair is the electrically "hot" side. When operated in phase quadrature, the characteristic impedance is matched to that of the transmitter and the coupler assumes the characteristic of a point source. When the coupler is adjusted to achieve maximum power output, the first and second RF signals presented to radio frequency loads connected to its outputs are in phase quadrature. In this mode of operation the field strength of the radiated signal in the far field (at least 10 wavelengths away from the source) closely emulates a hemisphere. Approximately half of the transmitted energy (that above approximately 45 degrees elevation) radiates as a near vertical incidence skywave (NVIS), creating reflections from the ionosphere which are received within a radius of approximately 250–300 miles from the transmitting site. The lower half of the transmitted signal radiates at a low angle which creates a skywave, which is reflected from the ionosphere and may be received at greater distances from the transmitting site. Surface and space ground waves are also present but not predominant beyond the horizon. These groundwave signals are often enhanced by a NVIS signal. Reference is made to page 18-2 of the Radio Amateurs Handbook which was published by the American Radio Relay League (ARRL) in 1983. The polarization of the radiation is elliptical and communicates well with both vertically and horizontally polarized signals. In the case where components exist in both the vertical an horizontal planes, displaced in time by ninety degrees, polarization is elliptical. Circular polarization is the special case where the vertical and horizontal components are equal; the field effectively rotates. Reference is made to page 14-6 of the 1983 ARRL Handbook. There are no significant nulls or lobes with radiation at every horizontal azimuth and at every angle of radiation which is consistent with the radiation from a theoretical point source. A point source may be defined as a hypothetical antenna occupying a point in space and radiating uniformly in all directions. Reference is made to page 110 of "Antenna Theory and Design," Stutzman and Thiele, published by John Wiley & Sons, Inc in 1981. Alternatively, the coupler may also be connected across 240 VAC, 3-wire power lines. Chapters 3 and 4 of "Antennas" by John D. Kraus (Second Edition published in 1988 by McGraw-Hill, Inc,) contains a detailed discussion of point sources of radio frequency energy. On page 87 of the Kraus publication, power density of radiated energy in watts per square meter, or Poynting vector, is defined as the time rate of energy flow per unit area. On page 104 it is taught that in far field the E electric field vector and the H magnetic field vector are both transverse to the wave direction and are perpendicular to each other. It is also taught that the Poynting vector at a constant radius from a point source is everywhere radial. When using a buildings electrical wiring as an antenna, the wiring need not be energized in order to operate the coupler. As used herein the term "hot" refers to a conductor of a building's electrical wiring on which a voltage is present when the wiring is energized.

The coupler may be operated in an alternative lead-lag mode of operation where the phase difference between the output signals is varied over a range of phase angles for applications such as, for example, phased vertical antennas and other radiating structures that require dual inputs with dissimilar phase angles. The coupler of the invention includes a circuit for reducing noise received with incoming RF signals in the receive mode. The noise reduction circuit has two modes of operation; one for manmade noise (QRM) and one for natural noise (QRN). In both the QRM and the QRN modes the noise reduction circuit operates at the actual frequency being received. In the QRM mode it functions as an attenuator of manmade noises. In the QRN mode natural noises are coupled through a tuneable capacitive circuit (phase-leading) and through an inductive circuit (phase-lagging). The output signals of these two circuits are the same noise signals but of opposite polarity and phase. The two signals of opposite polarity and phase are summed to cancel the noise ahead of the reception of the incoming signals by a radio receiver. More specifically the coupler of the invention includes a noise reduction circuit for attenuating manmade and natural noise on the input RF signal. The noise reduction circuit for manmade noise comprises a capacitive circuit selectively connected to said input circuit to attenuate manmade noise in a receive mode. The noise reduction circuit for natural noise comprises a capacitive circuit selectively connected in a receive mode between said input circuit and the output of said capacitive output circuit so that cancellation of natural noise is accomplished by summing two signals which include natural noise that are received via different paths at the output of said capacitive output circuit with opposite polarity and phase thereby canceling noise.

BRIEF DESCRIPTION OF THE DRAWINGS

The multi-phase coupler with a noise reduction circuit is better understood by reference to the following schematic drawings, in which:

FIG. 1 is a prior art circuit which has been used for power splitting or phase shifting which divides an input radio frequency (RF) signal into two separate signals that are phase-shifted in reference to one another and to the input RF signal.

FIG. 2 illustrates a coupler which has two phase-shifted outputs, a capacitively phase-shifted output signal and an inductively phase-shifted output signal.

FIG. 3 is a schematic diagram of the preferred embodiment of the invention.

FIG. 4 is a schematic diagram of a coupler connected to a building's electrical wiring by a pair of power cords.

DETAILED DESCRIPTION

In FIG. 1 there is shown a prior art circuit 10 which divides power and shifts the phase of an input radio frequency signal. However it is a not practical circuit for dividing power, shifting phase a selected amount and matching impedance to the impedances of varying loads at different frequencies. An input radio frequency signal is received at receptacle 12 from an external RF source (not shown) and from there coupled to the junction of capacitor 14 and inductance 16. Capacitor 14 produces an output signal which is shifted in phase to lead the phase of the input RF signal. This phase-leading output signal is coupled to output connector 18. Inductance 16 produces an output RF signal which is shifted in phase to lag the phase of the input RF signal. This phase-lagging output RF signal is coupled to output connector 20. Thus the output signals at output connectors 18 and 20 are phase-shifted with respect to each other and with respect to the input RF signal received at connector 12. Capacitor 14 may be a variable capacitor for varying the phase of the output.

In FIG. 2 there is shown a basic embodiment of a two-phase coupler 22 wherein an input RF signal is received at connector 24. Coupler 22 comprises matching capacitor 26, phase shifting capacitor 28, output connector 30, tuneable phase-shifting inductance 32, output coupling inductance 34 and output connector 36. This embodiment of the invention illustrates power splitting of an input RF signal into two phase-shifted first and second radio frequency output signals, circuitry for varying of the phase relationship between the two output signals, and the variable impedance matching of the input RF signal by variable capacitor 26 to the LC combination of capacitor 28 and tuneable inductance 32. Capacitor 28 produces an output RF signal which is shifted in phase to lead the phase of the input RF signal. This phase-leading output RF signal from capacitor 28 is coupled to output connector 30. Inductance 32 is inductively coupled to inductance 34 for producing an output RF signal which is shifted in phase to lag the phase of the input RF signal. This phase-lagging output RF signal is coupled to output connector 36. Thus the output RF signals at output connectors 30 and 36 are phase-shifted with respect to each other and with respect to the input RF signal received at connector 24. Capacitor 28 may be a variable capacitor for varying the phase of the output RF signal coupled to connector 30 and for matching the impedance of a load, i.e., antenna, connected at connector 30. Impedance matching of inductively phase-shifted lagging output RF signal coupled to output connector 36 may be varied by adding to or subtracting from the number of turns in winding coupling inductance 34.

In FIG. 3 there is shown a coupler 38 which is the preferred embodiment of the invention. Coupler 38 includes the features of the invention shown in FIG. 2 and also includes a novel noise reduction circuit and series and parallel resonant circuits for utilizing the coupler over a wide spectrum of RF frequencies. An input radio frequency signal is received at receptacle 40 from an external RF source (not shown) and from there coupled to variable capacitor 42. In FIG. 3 ground connections are each labeled with the symbol therefor and with GND. The impedance of the input RF signal is matched by variable capacitor 42 to the LC combination of inductance 44 and variable capacitor 46. The RF signal at the output of capacitor 42 is coupled to tap T1 of inductance 44. The signal at a first end of inductance 44 is coupled to output capacitor 46. Inductance 44 and capacitor 46 divide the input RF signal into two output signals. A portion of inductance 44 and capacitor 46 produces an output RF signal which is shifted in phase to lead the phase of the input RF signal. This phase-leading output signal from capacitor 46 is coupled to output connector 48. Capacitor 46 is a variable capacitor for varying the phase of the output signal from capacitor 46 with respect to the phase of the output signal from inductance 50 and with respect to the phase of the input RF signal received at connector 40 and for matching the impedance of a load, i.e., antenna, connected at coaxial output connector 48. Inductance 44 is inductively coupled to inductance 50 for producing an output RF signal which is shifted in phase to lag the phase of the input RF signal. This phase-lagging output RF signal is coupled from inductance 50 to coaxial output connector 52 through a lead-lag network as described below. The second end of inductance 50 shares a common ground with a second end of inductance 44. A balanced output from inductance 50 may be implemented by utilizing the signals at the first and second ends of inductance 50 instead of grounding the second end of inductance 50. Thus the output signals at output connectors 48 and 52 are phase-shifted with respect to each other and with respect to the input RF signal received at connector 40. Inductances 44 and 50 are wound on powdered iron toroidal cores for self-shielding and for significantly reducing the size of these as compared to air-wound inductances.

A series resonant circuit is formed by connecting variable capacitor 54 between the first end of inductance 44 and a second end of inductance 44 which is grounded. A parallel resonant circuit is formed by connecting variable capacitor 56 between tap T2 of inductance 44 and the second end of inductance 44. Capacitors 54 and 56 are mechanically ganged together to simultaneously resonate with inductance 44 at two different frequencies, preferably non-harmonically related frequencies. Capacitor 54, which is connected in series with inductance 44, tunes one resonant circuit through a first range of RF frequencies. Capacitor 56, which is connected in parallel with inductance 44, tunes one resonant circuit through a second range of RF frequencies. The use of a series and a parallel resonant circuit permits the use of coupler 38 over a large range of frequencies without the use of separate plug-in inductance coils or switches for changing bands. In this preferred embodiment series capacitor 54 tunes inductance 44 over a first range of frequencies from approximately 3.0 to approximately 12.0 MHz and parallel capacitor 56 tunes a portion of inductance 44 from tap T2 to its grounded second end over a second range of frequencies from approximately 12.0 to approximately 60.0 MHz. To extend the ranges of tuneable RF frequencies variable capacitor 58 is connected in parallel with capacitor 54. Use of capacitor 58 extends the first range of tuneable RF frequencies downward from approximately 3.0 MHz to approximately 1.5 MHz in the medium frequency (MF) spectrum without additional inductance or switches.

Capacitor 60 is a blocking capacitor for coupling the first output RF signals from capacitor 46 and inductance 50 to the "hot" terminal of receptacle 62 without allowing AC voltage and power from the electrical wiring into coupler 38. Receptacle 62 is connected to one wire of a building's electrical wiring identified as "AC2" in FIG. 3 but not shown. Capacitor 60 presents a low impedance to the first output RF signals from capacitor 46 and inductance 50 at frequencies ranging from the low end of the MF band, through the HF band and up into the VHF band. The NEUTRAL connection of receptacle 62 is not used.

The second output RF signal from inductance 50 is routed to capacitor 64 and to one terminal of lead-lag switch 66. Switch 66 is a single pole, double throw switch. The relative phase difference between the first and second output RF signals may be significantly altered by switching switch 66 between its lead and lag positions. In its lag position switch 66 routes the second output RF signal to output connector 52 and to one terminal of switch 68. In its lead position switch 66 routes the second output RF signal from the output of capacitor 64 to output connector 52 and to one terminal of switch 68. Switch 68 is a single pole, double throw switch. In the 120 VAC position switch 68 routes the second output RF signal to the NEUTRAL connection of receptacle 72. Receptacle 72 is connected to receive electrical power from an electrical wire of a building identified as "AC1" in FIG. 3 but not shown. In the 240 VAC position switch 68 routes the second output RF signal through capacitor 70 to the "hot" connection of receptacle 72. Capacitor 70 is a blocking capacitor for coupling the second output RF signal and for preventing AC voltage and power from the a building's electrical wiring from entering into coupler 38. In the 120 VAC position of switch 68 the first and second output RF signals are connected across the "hot" and neutral connections of two different 120 VAC power outlets, respectively. In the 240 VAC position of switch 68 the first and second output RF signals are connected across two different "hot" phases of two different 120 VAC wires (not shown), respectively.

Alternatively, coaxial cables may be connected between coaxial output connectors 48 and 52 and a pair of radiating structures, such as, for example, unterminated, parallel balanced feedlines operated in phase quadrature to act as a "point source" or a pair of conventional antennas such as, for example, phase verticals operated in phase quadrature, in the preferred mode of operation.

Switch 74, capacitor 76 and switch 78 comprise a noise reduction circuit for reducing noise received with incoming RF signals. When in its "R" position, switch 78 enables the noise reduction circuit. This noise reduction circuit has two modes of operation; one for manmade noise (QRM) and one for natural noise (QRN). In both the QRM and the QRN modes the noise reduction circuit operates at the actual frequency being received. In the OFF position of switch 78 both the QRM and ORN modes are disabled.

In the QRM mode the input RF signal received at input receptacle 40 is routed through switch 78 to capacitor 76. The capacitance of capacitor 76 is selected to attenuate manmade noises. Capacitor 76 is connected to ground through switch 74 which is a single pole, three position switch. Switch 78 may be replaced by a relay and a sensor which senses RF power (not shown). In the transmit (T) mode the relay would open and stay open until RF power is no longer sensed.

In the QRN mode natural noises are coupled through a tuneable capacitive circuit (phase-leading) comprising capacitor 76 and through an inductive circuit (phase-lagging) capacitor 46. The output signals of these two circuits are the same noise signals but of opposite polarity and phase. When switch 74 is in the QRN position, the two signals of opposite polarity are summed to cancel the noise ahead of the reception of the incoming signals by a radio receiver.

In FIG. 4 there is shown a coupler 38 connected to a pair of radiating structures, i. e., radio frequency loads. The loads comprise a pair of electrical conductors which are power cords connected to AC electrical wiring. Power cords 82 and 84 are connected to 120 VAC power receptacles 86 and 88 which are connected to the AC electrical wiring at a particular installation. The cords are spaced a few inches apart at receptacles 62 and 72. Preferably, cords connected to AC power outlets are spaced six to eight feet apart. By being spread apart to connect to two separate AC power outlets power cords function as a well-known Delta impedance match between coupler 38 and the electrical wiring. This preferred separation assures that an initial phase-shift between the first and second output RF signals will be present during the initial tuning of coupler 38 each time it is placed in operation.

Operation of coupler 38 comprises connecting the RF output signal from a RF generator (not shown) that operates in the radio frequency spectrum of approximately 1.5 MHz to 60.0 MHz. Two power cords are connected to the RF power output connectors 62 and 72. Spreading apart these two power cords out to a pair of AC power outlets which are spaced from approximately six to approximately eight feet apart provides initial "Delta" impedance match and initial phase shift between coupler output receptacles 62 and 72 and the AC electrical wiring at AC power outlets 86 and 88.

In relation to FIG. 3, tuning of coupler 38 is accomplished by adjusting capacitors 54, 56 and 58 for resonance with inductance 44 as indicated by a first maximum output power. A second indication of maximum power output is achieved by adjusting capacitors 42 and 46. When maximum power output is achieved, the first and second RF signals presented to the radio frequency loads connected to output receptacles 62 and 72 are in phase quadrature. An indication of maximum power output may be obtained by connecting an RF sensor (not shown) to the "hot" terminal of output receptacle 62.

For HF/VHF operation, capacitor 58 is set for minimum capacitance, which permits coupler 38 to operate over the range of 3.0 MHz to 60 MHz. For MF operation, capacitor 58 is set for maximum capacitance, which extends the lower frequency of operation down to approximately 1.5 MHz. Capacitor 42 optimizes the impedance match between an external RF generator (not shown) and coupler 38. Capacitor 46 optimizes the impedance match coupler 38 first RF output signal and connectors 48 and 62. Switch 66 permits selection of either lead or lag phase-shift of the second RF output signal at connectors 52 and 72. Switch 68 permits interfacing the second RF output signal to whichever type (120VAC single phase to neutral or phase to phase, 120 VAC to 120 VAC, of three-phase 240 VAC) electrical wiring that is available at a particular installation.

The noise reduction circuit functions only in the receive (R) mode. This selection is made by switching switch 78 from transmit mode (T) to the receive mode (R). Switch 74 selects noise reduction action on received signals that contain either manmade (QRM) or natural (QRN) noises. In either circumstance, capacitor 76 is adjusted for maximum signal to noise ratio (SNR).

In the QRM mode capacitor 76 becomes the grounded end of a capacitive voltage divider formed with capacitor 42. In the QRN mode capacitor 76 is adjusted to produce an out-of-phase copy of the incoming received signal which is at the output of inductance 44 and tap T1. In these modes noise reduction may be accomplished by either signal attenuation or by phase-cancellation before noise can enter the receiver's input circuit.

Consider now how the noise reduction circuit may be utilized as a separate circuit in conjunction with radio receiving devices other than the coupler. A first embodiment of a separate noise reduction circuit operating on a single input radio frequency signal may be constructed by utilizing certain components shown in FIG. 3. More specifically, a first path comprises an input, receptacle 62 coupled to a variable capacitor 76, which in turn is coupled to receptacle 40. Receptacle 40 acts as an output in the receive (R) mode. A second parallel path comprises an inductor, which is a portion of inductor 44, coupled between the same input in the receive (R) mode receptacle 62 and receptacle 40. Assume that in the receive (R) mode a first radio frequency signal is received by power cord 82 and presented to the "hot" connection of receptacle 62. This signal is shifted in phase by capacitor 76 to be a phase-leading second signal at receptacle 40. The same input RF signal is shifted in phase by inductor 44 to be a phase-lagging third signal at receptacle 40. The sum of the second and third signals at receptacle 40, which operates as a summing point, is an output signal in the receive (R) mode. Noise of opposite polarity and phase on the two signals presented by capacitor 76 and inductor 44 is canceled and is therefore not present in the output radio frequency signal at receptacle 40. Noise on the input signal is advanced in phase by capacitor 76 and retarded in phase by inductor 44 and therefore cancels when the polarity at receptacle 40 is opposite. Capacitor 76 is a variable capacitor so that the phase change may be adjusted to achieve optimum cancellation.

A second embodiment of a separate noise reduction circuit utilizing two input may be constructed by utilizing a different combination of components shown in FIG. 3. More specifically, a first path comprises an input, receptacle 62 coupled to a variable capacitor 76, which in turn is coupled to a receptacle 40. Receptacle 40 acts as an output in the receive (R) mode. A second parallel path comprises an inductor, which is a portion of inductor 44, coupled between the same input in the receive (R) mode receptacle 62 and receptacle 40. Assume that in the receive (R) mode a fourth radio frequency signal is received by power cord 82 and presented to the "hot" connection of receptacle 62. This signal is shifted in phase by capacitor 76 to be phase-leading at receptacle 40. A second path comprises receptacle 72 which is coupled to inductance 50 which is inductively coupled to inductance 44, which in turn is coupled to receptacle 40 in the receive (R) mode). Assume that in the receive (R) mode first and fourth radio frequency signals are received by power cords 82 and 84 and presented to the "hot" connections of receptacles 62 and 72, respectively. The first signal is shifted in phase by capacitor 78 to be phase-leading at receptacle 40 as discussed above. The fourth RF signal is shifted in phase by inductors 50 and 44 to be a phase-lagging fifth signal at output receptacle 40. The sum of the second, third and fifth signals at output receptacle 40, which operates as a summing point, is an output signal in the receive (R) mode. Noise of opposite polarity and phase on the two signals presented by capacitor 76 and inductors 50 and 44 is canceled and is therefore not present in the output radio frequency signal at receptacle 40. Noise on the input signal is advanced in phase by capacitor 76 and retarded in phase by inductors 50 and 44 and therefore cancels when the polarity at receptacle 40 is opposite. Capacitor 76 is a variable capacitor so that the phase change may be adjusted to achieve optimum cancellation.

A third embodiment of a separate noise reduction circuit may be constructed by utilizing the components of the three paths taught with respect to the first and second separate embodiments, as shown in FIG. 3.

The use of the terms "capacitive circuit" and "inductive circuit" herein is intended to mean not only the lumped circuit components shown in the drawings, capacitors and inductances, but also any solid state circuit or other circuit which produces a leading or a lagging phase shift, respectively. Use of the terms "coupled" and "coupling" is intended to mean transfer of a signal by a direct connection, such as an electrical conductor, or by an additional lumped circuit component shown or not shown or by an additional circuit not shown.

The broadest aspects of the invention are sought to be claimed in the broadest way known in drafting this specification.

I claim:

1. A coupler for shifting the phase of a radio frequency input signal into at least two output signals that are phase shifted with respect to one another comprising:

a) an input circuit for receiving a radio frequency input signal;

b) an inductive output circuit, connected to said input circuit to receive the input signal, for shifting inductively the phase of the input signal, said inductive output circuit outputting a first radio frequency output signal having a phase which lags a phase associated with the input signal, said inductive output circuit comprising a transformer having a first and a second coil, said first coil connected to said input circuit to receive the radio frequency input signal and said second coil inductively coupled to said first coil for outputting the first radio frequency output signal; and c) a capacitive output circuit, connected to said input circuit to the radio frequency input signal, for shifting capacitively the phase of the radio frequency input signal, said capacitive circuit outputting a second radio frequency output signal having a phase which leads the phase of the radio frequency input signal.

2. The coupler as claimed in claim 1, wherein said input circuit is a capacitive input circuit for matching the impedance of the radio frequency input signal to the impedance of said inductive output circuit and wherein said capacitive output circuit is adjustable for varying a phase relationship between the first and second radio frequency output signals.

3. The coupler as claimed in claim 2, wherein said capacitive input circuit is adjustable for impedance matching the radio frequency input signal to the impedance of said inductive output circuit over a range of radio frequencies.

4. The coupler as claimed in claim 1, wherein said first and second radio frequency output signals are in phase quadrature.

5. The coupler as claimed in claim 1, wherein said capacitive output circuit is adjustable for adjusting the phase of the second radio frequency output signal to be in phase quadrature with the first output signal.

6. The coupler as claimed in claim 1, wherein said first coil has a first tap, wherein a first end of said first coil and a first end of said capacitive output circuit are connected at a first junction, wherein the radio frequency input signal is a transmit signal received at said first tap of said first coil, and further including a series capacitor connected between said first junction and a second end of said first coil whereby a portion of said first coil and said series capacitor comprise a series resonant circuit for resonating at a first frequency of the radio frequency input signal.

7. The coupler as claimed in claim 6, wherein said series capacitor is a variable capacitor for resonating said series resonant circuit over a range of frequencies of the first radio frequency output signal.

8. The coupler as claimed in claim 6 wherein the coupler further operates in a receive mode reciprocal to an operation thereof in a transmit mode, further including a noise reduction circuit for attenuating noise on a first radio frequency receive signal, said noise reduction circuit comprising a capacitive circuit connected between said input circuit and a second end of said capacitive circuit at a second junction, said second junction receiving a first radio frequency receive signal, said noise reduction circuit producing a second radio frequency receive signal which leads the first radio frequency receive signal in phase, said portion of said second coil producing a third radio frequency receive signal which lags the first radio frequency receive signal in phase, noise of opposite polarity and phase being cancelled by summing said second and third receive signals at a third junction in said input circuit, said third junction presenting an output receive signal.

9. The coupler as claimed in claim 1, further including a noise reduction circuit for attenuating manmade noise on the radio frequency input signal, said noise reduction circuit comprising a capacitive circuit connected to said input circuit to attenuate manmade noise.

10. The coupler as claimed in claim 1, wherein said inductive output circuit includes a series resonant circuit and a parallel resonant circuit, wherein a first end of said first coil and said capacitive output circuit are connected at a first junction, wherein said first coil includes first and second taps, wherein the input signal is received by said inductive output circuit at said first tap of said first coil, further including a series capacitor connected between said first junction and a second end of said first coil, whereby a portion of said first coil and said series capacitor comprise the series resonant circuit for resonating at the frequency of the radio frequency input signal, and further including a parallel capacitor connected to said first coil between said second tap and the second end of said first coil whereby another portion of said first coil and said parallel capacitor comprise the parallel resonant circuit for resonating at the frequency of the radio frequency input signal.

11. The coupler as claimed in claim 10, wherein said series capacitor is a variable capacitor for resonating said series resonant circuit at any frequency in a first range of frequencies of the first radio frequency output signal and wherein said parallel capacitor is a variable capacitor for resonating said parallel resonant circuit at any frequency in a second range of frequencies of the first radio frequency output signal.

12. The coupler as claimed in claim 11, wherein said parallel capacitor and said series capacitor are ganged capacitors so that respective resonant frequencies in said first and second ranges of frequencies are not harmonically related.

13. The coupler as claimed in claim 1, further including first and second radio frequency loads which are connected to said inductive output circuit and to said capacitive output circuit, respectively, to receive said first and second radio frequency output signals.

14. The coupler as claimed in claim 13, wherein said first and second radio frequency loads respectively comprise first and second electrical conductors.

15. The coupler as claimed in claim 14, wherein said first and second electrical conductors comprise first and second power cords adapted to be connected between said respective inductive and capacitive output circuits and first and second AC power receptacles connected to electrical wiring for receiving electrical power.

16. The coupler as claimed in claim 15, wherein said first and second power receptacles are spaced apart from each other to provide an impedance match between said inductive and capacitive output circuits and the electrical wiring, respectively.

17. The coupler as claimed in claim 15, further including a switch connected between said second coil of the inductive output circuit and said first radio frequency load, said switch having a first position for connecting said inductive output circuit to receive voltage from said first electrical conductor, said switch having a second position for connecting said inductive output circuit to a neutral connection of said electrical wiring.

18. The coupler as claimed in claim 13, further including first and second blocking capacitors, said first blocking capacitor connected to said inductive output circuit to receive said first output signal, said second blocking capacitor connected to said capacitive output circuit to receive said second output signal, and wherein said first and second radio frequency loads are first and second electrically conductive wires connected to said first and second blocking capacitors, respectively, to receive said first and second radio frequency output signals, thereby radiating radio frequency energy.

19. The coupler as claimed in claim 1, wherein said inductive output circuit includes a parallel resonant circuit, wherein a first end of said first coil and said capacitive output circuit are connected at a first junction, wherein the input signal is received at a first tap of said first coil, and further including a parallel capacitor connected between a second tap of said first coil and a second end of said first coil whereby a portion of said first coil and said parallel capacitor comprise the parallel resonant circuit for resonating at a first frequency of the radio frequency input signal.

20. The coupler as claimed in claim 19, wherein said parallel capacitor is a variable capacitor for resonating said parallel resonant circuit over a range of frequencies of the first radio frequency output signal.

21. A coupler for shifting the phase of a radio frequency input signal into at least two transmit signals that are phase shifted with respect to one another for transmitting radio frequency energy by radio frequency radiating structures in a transmit mode and for receiving radio frequency receive signals from the structures in a receive mode comprising:

a) an electrical connection for receiving a radio frequency transmit signal and for outputting radio frequency receive signals;

b) an inductive circuit, connected to said electrical connection to couple a radio frequency transmit signal in a transmit mode and to couple radio frequency receive signals in a receive mode, said inductive ciruit shifting inductively the phase of the radio frequency transmit signal, said inductive circuit outputting a first output transmit signal having a phase which lags a phase associated with the radio frequency transmit signal, said inductive circuit comprising a first and a second coil, said second coil inductively coupled to said first coil for outputting the first output transmit signal, said inductive circuit operating in a receive mode reciprocally to an operation thereof in a transmit mode;

c) a capacitive circuit, connected to said electrical connection to receive the radio frequency transmit signal in a transmit mode and to couple radio frequency receive signals in a receive mode, said capacitive circuit shifting capacitively the phase of the radio frequency transmit signal, said capacitive circuit outputting a second output transmit signal having a phase which leads the phase of the radio frequency transmit signal, said first and second output signals being shifted from the phase of the input transmit signal to be in phase quadrature with respect to each other, said capacitive circuit operating in a receive mode reciprocally to an operation thereof in a transmit mode; and d) said radio frequency radiating structures comprising first and second radio frequency radiating structures, which are connected to said second coil of said inductive circuit and to said capacitive circuit, respectively, to receive said first and second output signals, respectively, and to radiate radio frequency energy in the transmit mode and to receive radio frequency energy in the receive mode, the radio frequency receive signals being coupled from said structures to said second coil of said inductive circuit and to said capacitive circuit in a receive mode.

22. The coupler and radiating structures as claimed in claim 21, wherein the radio frequency energy transmitted by said first and second radiating structures in the transmit mode has a field pattern with the characteristic of a point source in that the Poynting vectors at locations at a constant radius from the coupler are substantially radial.

23. The coupler and radiating structures as claimed in claimed 21, wherein the radio frequency energy transmitted by said first and second radiating structures in the transmit mode is reflected as a near vertical incidence skywave.

24. A noise reduction circuit for attenuating radio frequency noise on a first RF signal, said noise reduction circuit comprising a capacitive circuit and a first inductive circuit connected in parallel, said capacitive circuit and said inductive circuit connected to a first input for receiving the first RF signal, said capacitive circuit producing a second RF signal from said first RF signal which leads the first RF signal in phase, said first inductive circuit producing a third RF signal from said first RF signal which lags the first RF signal in phase, said second and third RF signals being summed at a summing point to cancel noise of opposite polarity and phase, thereby producing an output RF signal at the summing point.

25. The circuit as claimed in claim 24, wherein the capacitive circuit comprises at least one variable capacitor coupled between said first input and said summing point and said first inductive circuit comprises an inductance coupled between said first input and said summing point.

26. The circuit as claimed in claim 24, further including a second input for receiving a fourth RF signal and a second inductive circuit connected between said second input and the summing point of said second and third RF signals, said second inductive circuit producing a fifth RF signal from said fourth RF signal which lags the fourth RF signal in phase, said second, third and fifth RF signals being summed at the summing point to cancel noise of opposite polarity and phase thereby producing an output RF signal at the summing point.

27. A coupler for shifting the phase of a radio frequency input signal into at least two output signals that are phase shifted with respect to one another comprising:

a) an input circuit for receiving a radio frequency input signal;

b) an inductive output circuit, connected to said input circuit to receive the input signal, for shifting inductively the phase of the input signal, said inductive output circuit outputting a first radio frequency output signal having a phase which lags a phase associated with the input signal, said inductive output circuit comprising a transformer having a first and a second coil, said first coil connected to said input circuit to receive the radio frequency input signal and said second coil inductively coupled to said coil for outputting the first radio frequency output signal; and c) a capacitive output circuit, connected to said input circuit to receive the radio frequency input signal, for shifting capacitively the phase of the radio frequency input signal, said capacitive circuit outputting a second radio frequency output signal having a phase which leads the phase of the radio frequency input signal, said capacitive output circuit being adjustable for adjusting the phase of the second radio frequency output signal to be in phase quadrature with the first output signal.

* * * * *